United States Patent
Van Kampen et al.

(10) Patent No.: US 10,964,505 B2
(45) Date of Patent: Mar. 30, 2021

(54) NATURALLY CLOSED MEMS SWITCH FOR ESD PROTECTION

(71) Applicant: CAVENDISH KINETICS, INC., San Jose, CA (US)

(72) Inventors: Robertus Petrus Van Kampen, S-Hertogenbosch (NL); Lance Barron, Plano, TX (US); Roberto Gaddi, Rosmalen (NL); Richard L. Knipe, McKinney, TX (US)

(73) Assignee: Cavendish Kinetics, Inc., San Jose, CA (US)

( * ) Notice: Subject to any disclaimer, the term of this patent is extended or adjusted under 35 U.S.C. 154(b) by 65 days.

(21) Appl. No.: 15/772,132

(22) PCT Filed: Nov. 15, 2016

(86) PCT No.: PCT/US2016/061937
§ 371 (c)(1),
(2) Date: Apr. 30, 2018

(87) PCT Pub. No.: WO2017/087341
PCT Pub. Date: May 26, 2017

(65) Prior Publication Data
US 2019/0066958 A1 Feb. 28, 2019

Related U.S. Application Data

(60) Provisional application No. 62/256,045, filed on Nov. 16, 2015.

(51) Int. Cl.
*H01H 59/00* (2006.01)
*H01L 23/60* (2006.01)
*H01H 1/00* (2006.01)

(52) U.S. Cl.
CPC ......... *H01H 59/0009* (2013.01); *H01L 23/60* (2013.01); *H01H 2001/0078* (2013.01)

(58) Field of Classification Search
CPC ........ H01H 2001/0078; H01H 59/0009; H01L 23/60
(Continued)

(56) References Cited

U.S. PATENT DOCUMENTS 5,638,946 A * 6/1997 Zavracky ............... G11C 23/00
200/181
6,046,659 A * 4/2000 Loo ....................... B81B 3/0072
200/181
(Continued)

FOREIGN PATENT DOCUMENTS

CN 101018734 A 8/2007
CN 103889887 A 6/2014
(Continued)

OTHER PUBLICATIONS

Office Action issued in corresponding Chinese Patent Application No. 2016800664442, dated Feb. 25, 2019 (12 pages).
(Continued)

*Primary Examiner* — Bernard Rojas
(74) *Attorney, Agent, or Firm* — Withrow & Terranova, P.L.L.C.

(57) ABSTRACT

The present disclosure generally relates to a MEMS device for reducing ESD. A contacting switch is used to ensure that there is a closed electrical contact between two electrodes even if there is no applied bias voltage.

15 Claims, 14 Drawing Sheets

(58) Field of Classification Search
USPC .......................................... 335/78; 200/181
See application file for complete search history.

(56) References Cited

U.S. PATENT DOCUMENTS

| | | | | |
|---|---|---|---|---|
| 6,127,908 | A * | 10/2000 | Bozler | B81B 3/0021 330/66 |
| 6,191,671 | B1 * | 2/2001 | Schlaak | H01H 59/0009 200/181 |
| 6,236,491 | B1 * | 5/2001 | Goodwin-Johansson | B81C 1/00666 359/230 |
| 6,426,687 | B1 * | 7/2002 | Osborn | H01P 1/127 200/181 |
| 6,765,300 | B1 | 7/2004 | Wagenaar et al. | |
| 7,675,393 | B2 * | 3/2010 | Kawakubo | H01H 1/50 200/181 |
| 7,754,986 | B1 * | 7/2010 | Niblock | H01H 59/0009 200/181 |
| 2003/0214556 | A1 * | 11/2003 | Cabal | B41J 2/14 347/44 |
| 2006/0038643 | A1 * | 2/2006 | Xu | F03G 7/065 335/78 |
| 2007/0236307 | A1 * | 10/2007 | Liu | H01P 1/127 333/105 |
| 2010/0126834 | A1 | 5/2010 | Ikehashi | |

FOREIGN PATENT DOCUMENTS

| | | |
|---|---|---|
| JP | 2008210640 A | 9/2008 |
| WO | 2015017743 A1 | 2/2015 |

OTHER PUBLICATIONS

Search Report issued in corresponding Chinese Patent Application No. 2016800664442, dated Feb. 25, 2019 (4 pages).
International Search Report and Written Opinion dated Jan. 25, 2017, in corresponding applicatoin No. PCT/US2016/061937.
Search Report issued in corresponding Chinese Patent Application No. 2016800654442, dated Nov. 7, 2019 (4 pages).
Office Action issued in corresponding Chinese Patent Application No. 201680066444.2, dated Nov. 19, 2019 (17 pages).
Third Office Action for Chinese Patent Application No. 201680065444.2, dated Jun. 16, 2020, 15 pages.
Examination Report for European Patent Application No. 16804970.8, dated May 4, 2020, 4 pages.
Notification to Grant for Chinese Patent Application No. 20168006544.2, dated Dec. 16, 2020, 6 pages.
Notification of Reasons for Refusal for Japanese Patent Application No. 2018-525370, dated Oct. 27, 2020, 8 pages.

* cited by examiner

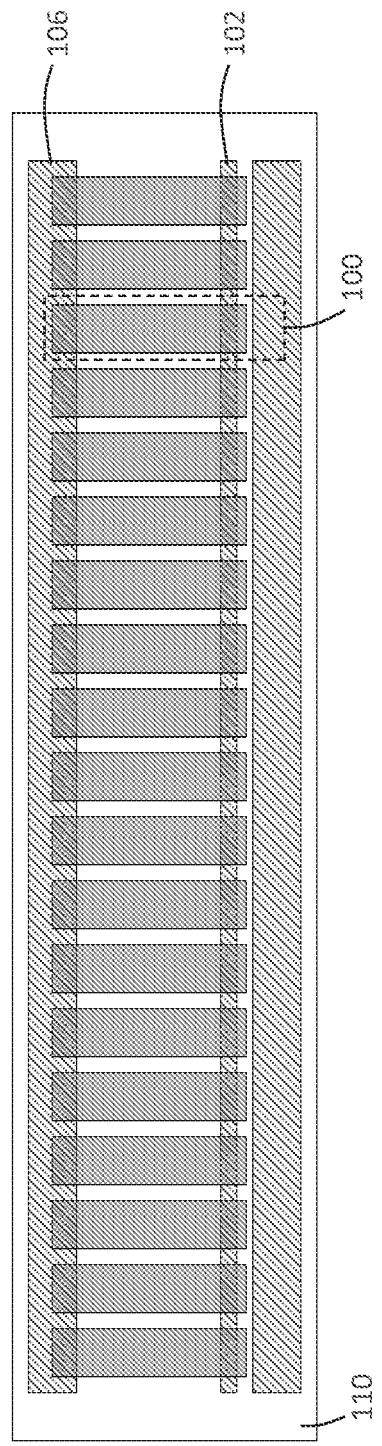

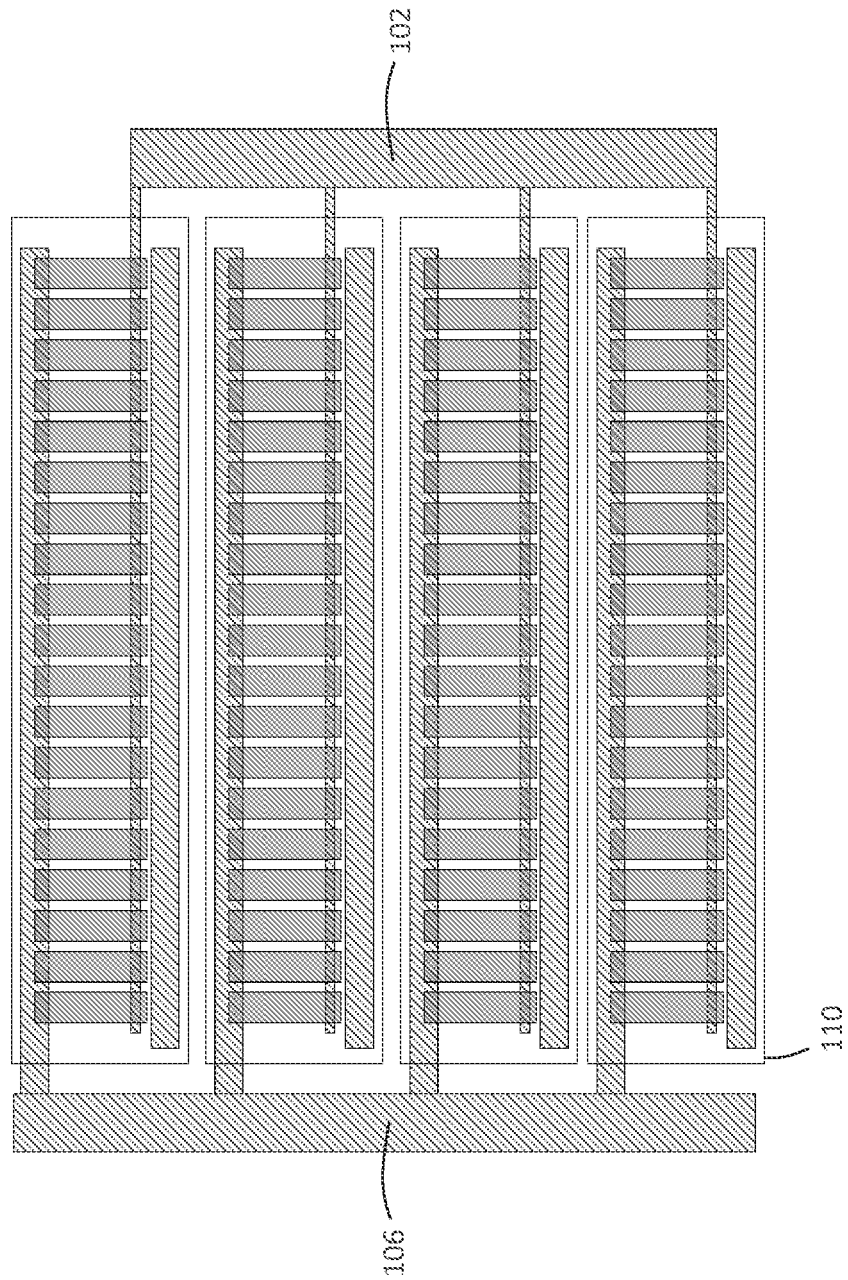

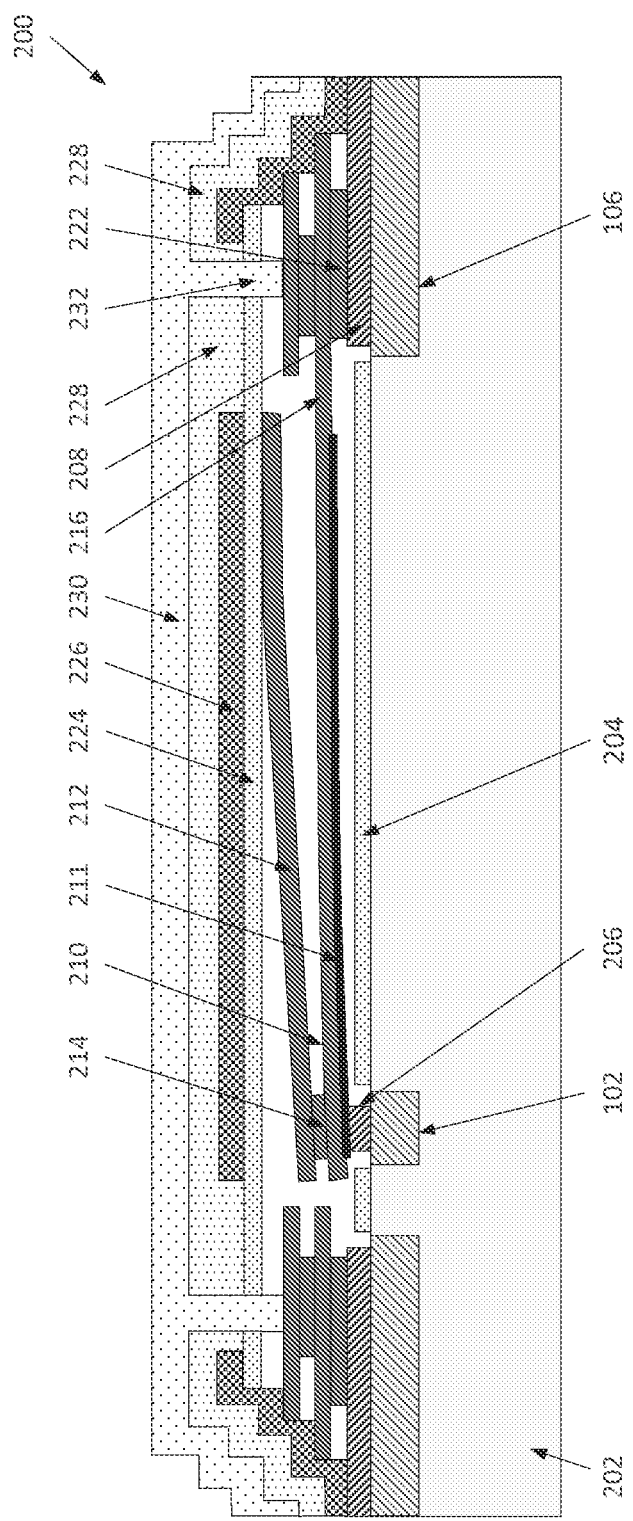

NATURALLY CLOSED MEMS SWITCH FOR ESD PROTECTION

BACKGROUND OF THE DISCLOSURE

Field of the Disclosure

Embodiments of the present disclosure generally relate to a micro electromechanical systems (MEMS) device for reducing risk of electro-static discharge (ESD).

Description of the Related Art

Devices including MEMS technology which have been designed and manufactured for applications in radio frequency telecommunications where risk of electro-static discharge is present, both during the manufacturing process (e.g. assembly) and in the typical usage conditions of the device (e.g. exposure to electrically charged human body). In particular, components such switches and tunable capacitors used to enable reconfigurable analog and mixed-signal circuits for state-of-the-art wireless devices.

ESD protection devices and circuits are an essential part of the solid state technology enabling electronic components and circuits. These solutions come with a significant performance penalty when applied to radio-frequency components. Key metrics such as insertion loss, isolation, linearity are significantly degraded when standard ESD protection techniques are used. MEMS technology can enable unprecedented performance levels when applied to the implementation of radio-frequency components such as switches and variable capacitors. But traditional ESD protection techniques would degrade such performance to unacceptable levels.

There is a need in the industry for new ESD solutions for MEMS based components that are able to maintain a high level of RF performance.

SUMMARY OF THE DISCLOSURE

The present disclosure generally relates to a MEMS device for reducing ESD. A contacting switch is used to ensure that there is a closed electrical contact between two electrodes even if there is no applied bias voltage.

In one embodiment, a MEMS device comprises a substrate having a first anchor electrode and an RF electrode disposed therein; a switching element comprising a stress layer, a bottom layer and a top layer, wherein the bottom layer is coupled to the top layer at a first end and the bottom layer is coupled to the anchor electrode at the second end and wherein the stress layer is under tensile stress.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 1B is a schematic top view of a switch-cell with a number of parallel operated naturally closed switches FIG. 1C is a schematic top view of a switch-array containing a number of parallel operated naturally closed switch-cells.

FIG. 3A is a schematic cross-sectional view of an MEMS naturally closed switch in the unpowered closed-state according to one embodiment

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The present disclosure generally relates to a MEMS device for reducing ESD. A contacting switch is used to ensure that there is a closed electrical contact between two electrodes even if there is no applied bias voltage.

Figure 1A:
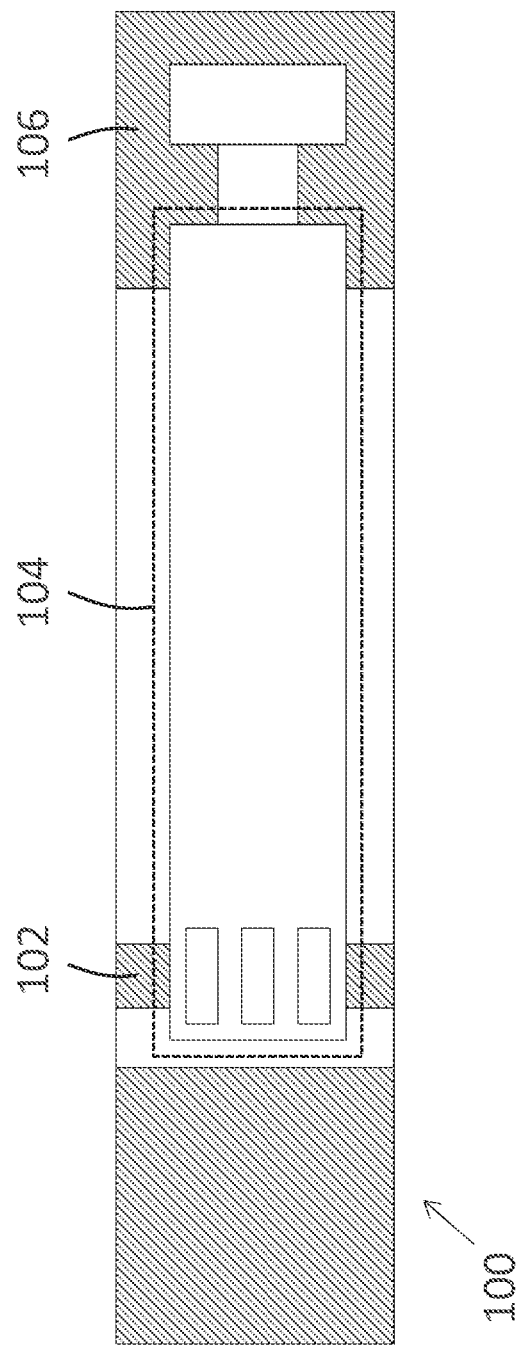
FIG. 1A is a schematic top view of a MEMS naturally-closed switch

FIG. 1A is a schematic top-view of a naturally closed ohmic MEMS switch 100. The switch 100 contains an RF-electrode 102, control-electrode 104 and anchor electrode 106. The switch provides for an ohmic contact between 102 and 106 in the unpowered state. The contact between 102 and 106 can be broken by applying a high-enough voltage to the control-electrode 106.

FIG. 1B is a schematic top view of a naturally closed ohmic MEMS switch cell 110 containing a number of naturally closed MEMS switches 100. All MEMS switches 100 in the cell 110 are operated in parallel and collectively have a lower resistance between the electrodes 102 and 106. All switches can be turned off by applying a high-enough voltage to the control-electrode.

FIG. 1C shows a schematic top-view of a naturally closed ohmic MEMS switch-array. It contains a number of parallel operated switch-cells 110. The RF-electrodes 102 of each cell are connected together at one end of each switch-cell 110, while the anchor-electrodes 106 are connected together at the other end of each switch-cell 110. When all cells are turned on this results in a further reduction of the resistance between the RF-electrode 102 and anchor electrode 106. At the same time, because many switches are operated in parallel the total switch-array can handle more current. All switches can be turned off collectively by applying a high-enough voltage to the control-electrode.

If such contacting switch is placed in parallel to an RF MEMS device such as a switch or variable capacitor, the contacting switch will provide a current path for protecting against ESD events at conditions during handling and assembly. Once the device is operating within the RF circuit/system, the contacting switch is opened by applying a bias voltage. The residual capacitive coupling and leakage between the open switch terminals will be minimized by design. This way, the RF performance of the RF MEMS device that was protected is maintained almost fully intact. This is the greatest advantage compared to other traditional ESD protection techniques based on solid-state technology, which inevitably degrade the RF performance of the MEMS device to be protected.

Figure 2A:
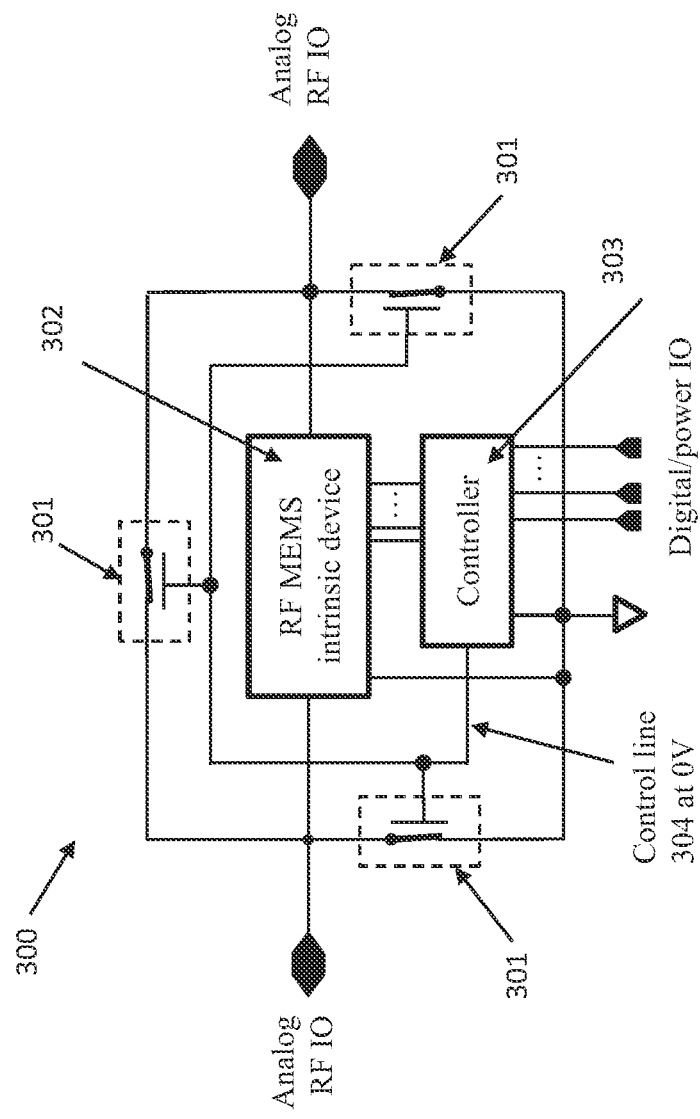
FIGS. 2A and 2B are schematic drawings of the naturally closed switch and how it can be combined with an RF MEMS device in order to provide ESD protection between any pair of analog/RF 10's.
Figure 2B:
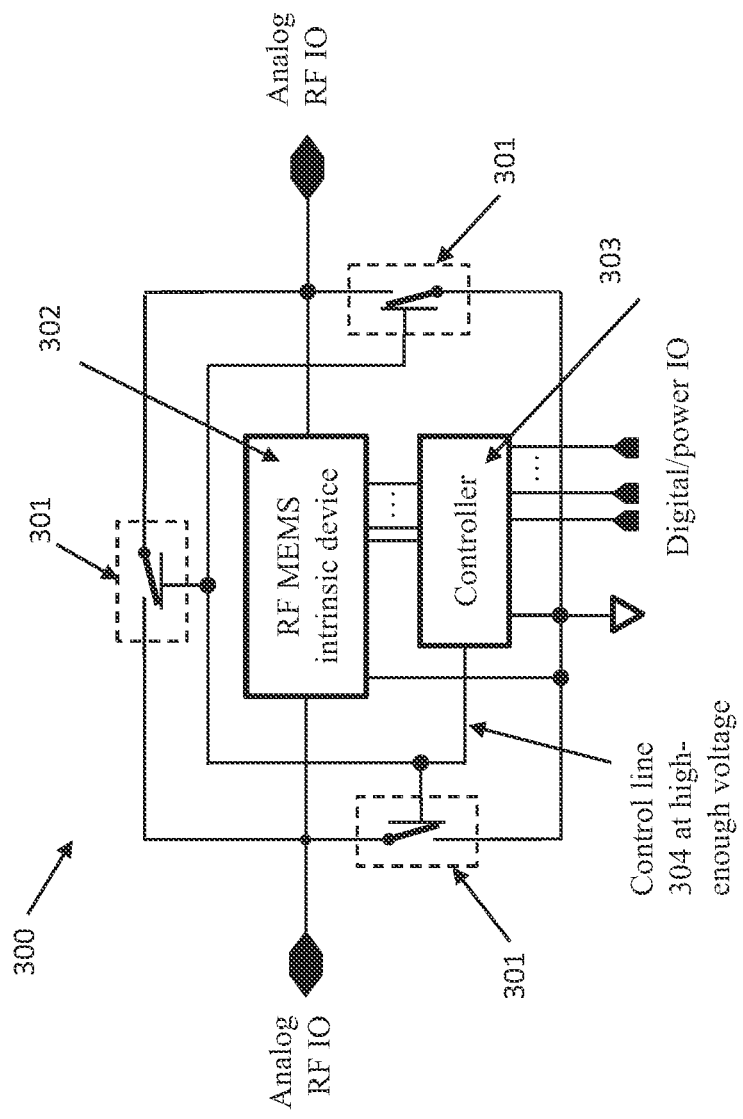
Figure 3B:
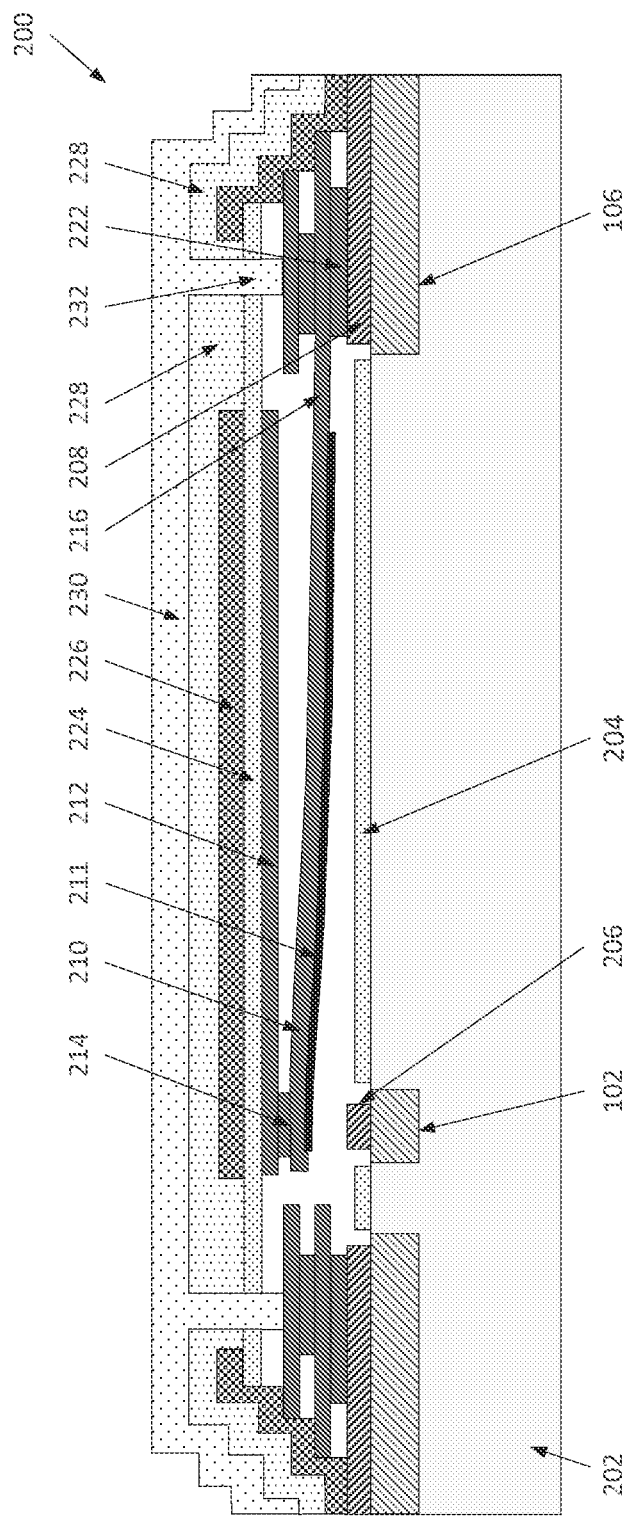
FIG. 3B is a schematic cross-sectional view of a MEMS naturally closed switch in the powered open-state according to one embodiment

FIGS. 2A and 2B schematic drawings of the naturally closed MEMS switch 301 and of the way it is combined with an RF MEMS device 302 and controller 303 in one package 300 in order to provide ESD protection by providing a low resistance path between any pair of analog/RF 10's. In FIG. 3A the naturally closed switches are unpowered and the control voltage applied to control-line 304 is at 0V. The switches 301 provide a low-ohmic path between all the analog/RF 10's. In FIG. 3B, the device 300 is turned on and the controller 303 applies a high-enough voltage on the control-line 304 which is connected to the control-electrodes of each switch 301. The switches 301 are now in the open-state and the analog/RF 10's are disconnected. The number of switches (FIG. 1A) to use in each switch-cell (FIG. 1B) and the number of switch-cells to use can be tuned depending on the required ESD-protection.

MEMS technology switches have a standard configuration where by design an electric contact between two electrodes can be closed or opened by applying bias voltage to one or more terminals. Without applying any bias voltage (unbiased condition), the state of the electrical contact is either undefined or open. In this disclosure, a new type of MEMS switch is described which is referred to as a "contacting" switch. The contacting switch presents a closed electrical contact between two electrodes even in the absence of applied bias voltage. This is achieved by specific mechanical design of the MEMS device, by managing the internal stress and strain conditions of the suspended MEMS membranes after the fabrication process is completed.

FIG. 3A shows a cross-section view of a naturally closed ohmic MEMS (contacting) switch 200 according to one embodiment. The contacting switch 200 contains an RF electrode 102 and anchor electrode 106 located on substrate 202. The substrate is covered with a dielectric layer 204 to protect other electrodes in different MEMS devices located on the same substrate. Suitable materials for the electrically insulating or dielectric layer 204 include silicon based materials including silicon-oxide, silicon-dioxide, silicon-nitride and silicon-oxynitride. The thickness of this layer 204 is typically in the range of 50 nm to 150 nm to limit the electric field in the dielectric layer. On top of the RF electrode 102 is the RF contact 206 to which the switch body forms an ohmic contact in the closed state. On top of the anchor-electrode 106 is the anchor contact 208 to which the MEMS device is anchored. Typical materials used for the contacting layers 206, 208 include Ti, TiN, TiAl, TiAlN, AlN, Al, W, Pt, Ir, Rh, Ru, $RuO_2$, ITO and Mo and combinations thereof.

The switch element contains a cantilever consisting of conductive layers 210, 212 which are joined together near the RF-contact 206 using vias 214. Suspension legs 216 are formed in the lower layer 210 which reduce the voltage required to operate the switch. The MEMS cantilever is anchored to the substrate with via 222. At the underside of the lower layer 210, is a stress-layer 211 which has a higher tensile stress than the lower layer 210. This causes the cantilever beam to flex downward until it hits the RF-contact 206. The contact force that the cantilever exerts on the RF-contact can be tuned with the dimensions of the lower-layer 210 and the stress-layer 211 as well as with the stress in these layers.

Above the MEMS cantilever there is a dielectric layer 224 which is capped with metal pull-up electrode 226 (the control-electrode) which is used to pull the MEMS up to the roof for the off state. Dielectric layer 224 avoids a short-circuit between the MEMS cantilever and the pull-up electrode 226 in the actuated-up state and limits the electric fields for high reliability. Moving the device to the top helps reduce the capacitance of the switch to the RF-electrode 102 in the off state. The cavity roof further contains an additional dielectric layer 228 for mechanical strength. The cavity is sealed with dielectric layer 230 which fills the etch release holes 232 used to remove the sacrificial layers which are present during fabrication. The dielectric layer 230 enters the etch release holes 232 and provides a further mechanical support to the top-layer 212 of the MEMS-cantilever in the anchors, while also sealing the cavity so that there is a low pressure environment in the cavity. Suitable materials for the roof dielectric layers 228, 230 include silicon based materials including silicon-oxide, silicon-dioxide, silicon-nitride and silicon-oxynitride.

When the lower layer 210 is deflected downwards, the upper layer 212 is moved downwards at the location of via 214 as well. Because of the deflection angle of the lower layer 210 at this location, the upper layer near the location of the legs 216 moves up, which reduces the gap between the control-electrode and the upper layer 212. This allows the contacting switch to be opened with a relatively low potential applied to the roof electrode 226. If the length of the upper layer 212 is long enough, the upper layer 212 can touch the roof dielectric 224 near the location of the leg 216. This further reduces the voltage required to pull the cantilever intimately up with the roof.

FIG. 3B shows the device in the actuated off state. A high enough voltage is applied to the control-electrode 226, which pulls the MEMS cantilever 211, 212 up towards the roof, thereby disconnecting the RF-electrode 102 from the anchor electrode 106.

The switch can be opened at one roof voltage for test after fabrication and then closed again to provide ESD protection to the packaged device until in use in the final application. By applying a higher voltage to the control-electrode, the device can be put permanently in the open-state, by zipping in the top-layer 212 on the top-dielectric 224 and increasing the contacting area. Stiction forces will hold the cantilever switch in the open-state.

The mechanical design of the contacting switch is based on engineering of residual absolute and gradient stress within a suspended membrane at the end of the fabrication process. Depositing a stack of materials with different residual stress conditions results in a final built-in gradient stress, which leads to the desired deformation of the suspended membrane.

Figure 4A:
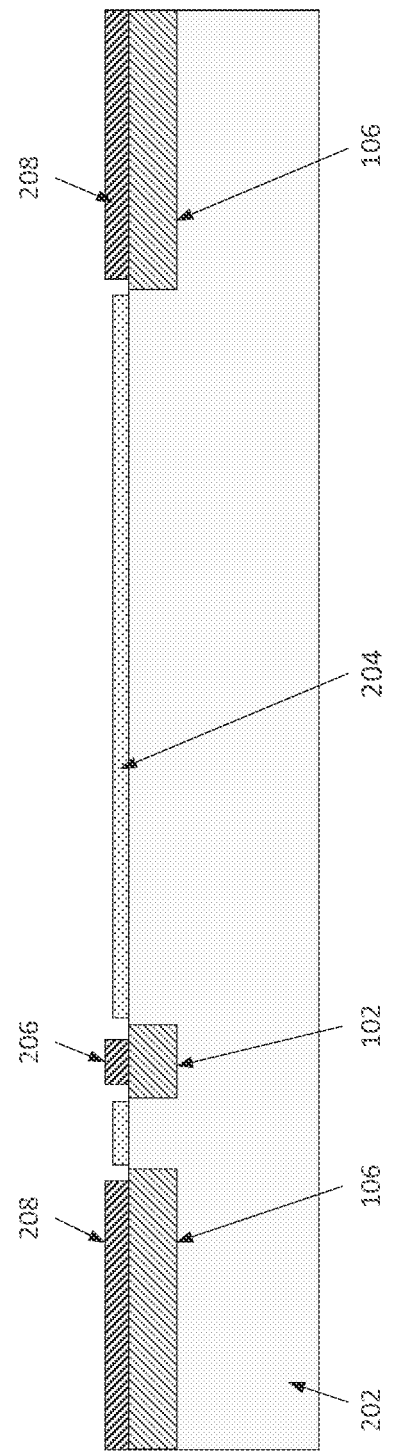
FIGS. 4A-4G are schematic illustrations of a MEMS ohmic switch at various stages of fabrication according to one embodiment.

FIGS. 4A-4G are schematic illustrations of the MEMS ohmic switch 200 at various stages of fabrication according to one embodiment. FIG. 4A shows the backplane starting material of the MEMS-switch and contains a substrate 202 with a plurality of electrodes including the RF electrode 102 and the anchor electrodes 106. It is to be understood that the substrate 202 may comprise a single layer substrate or a multi-layer substrate such as a CMOS substrate having one or more layers of interconnects. Additionally, suitable materials that may be used for the electrodes 102, 106 include titanium-nitride, aluminum, tungsten, copper, titanium, and combinations thereof including multi-layer stacks of different material. The substrate is covered with an electrically insulating layer 204 to protect other electrodes of different devices located on the same substrate. Suitable materials for the electrically insulating layer 204 include silicon based materials including silicon-oxide, silicon-dioxide, silicon-nitride and silicon-oxynitride. On top of the RF-electrode is RF contact 206 and on top of the anchor electrode 106 is anchor contact 208. Typical materials used for the contacts 206, 208 include Ti, TiN, TiAl, TiAlN, AlN, Al, W, Pt, Ir, Rh, Ru, RuO$_2$, ITO and Mo and combinations thereof.

Figure 4B:
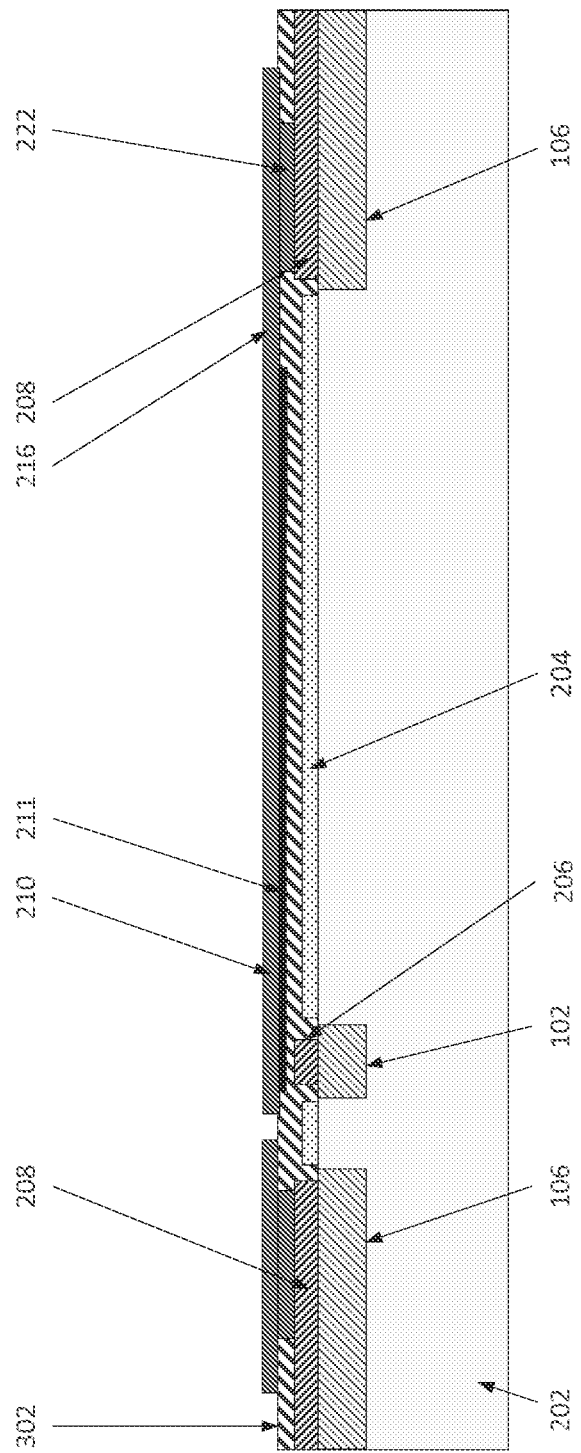

FIG. 4B shows the lower layer 210 of the MEMS cantilever which is formed on the backplane by depositing a sacrificial layer 302, depositing and patterning the stress layer 211, opening vias 222 in the sacrificial layer 302 and depositing and patterning the lower cantilever portion including the legs at 216. The MEMS cantilever is anchored to the anchor contact 208 with via 222 located on one side of the cantilever. The bottom side of stress layer 211 may be covered with an insulating layer which is partially removed over the RF-contact layer 206 to facilitate an ohmic contact to be made.

Figure 4C:
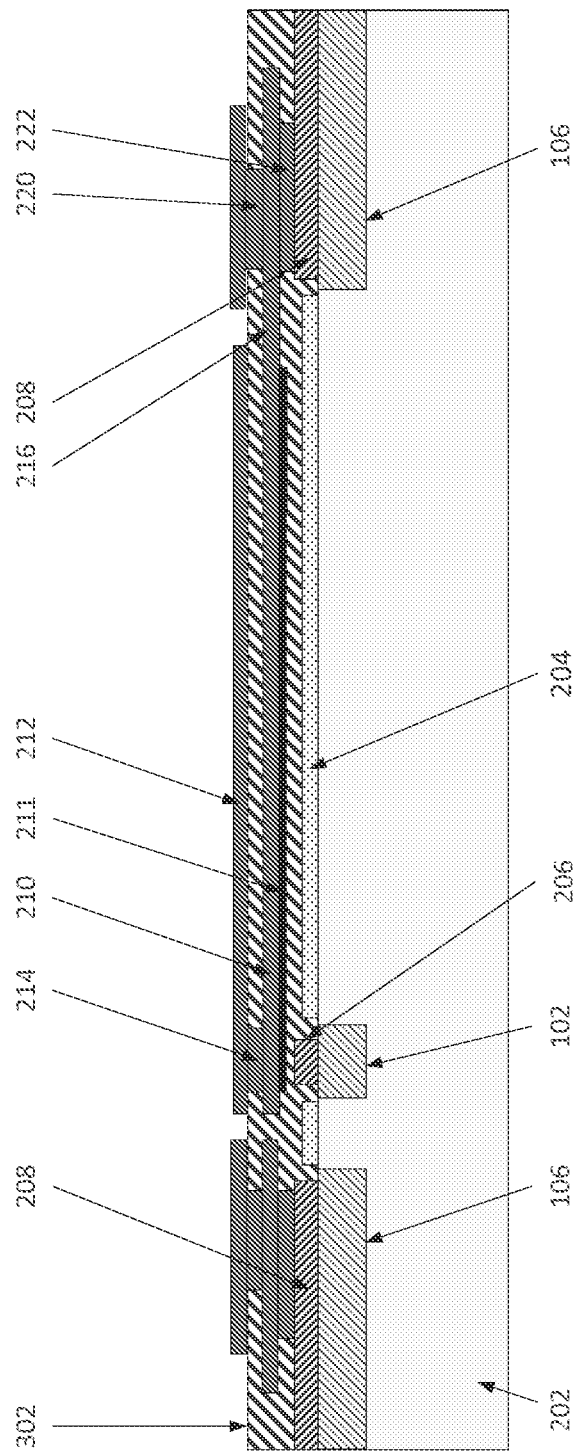

FIG. 4C shows the formation of the upper layer 212 of the MEMS cantilever. Additional sacrificial material 302 is deposited and openings are generated in in the locations of vias 220, 214 which land on the lower MEMS layer 210. The upper MEMS layer 212 is deposited and patterned to create the full MEMS cantilever 210, 211, 212 joined together by vias 214, containing legs 216 and anchor vias 220, 222.

Figure 4D:
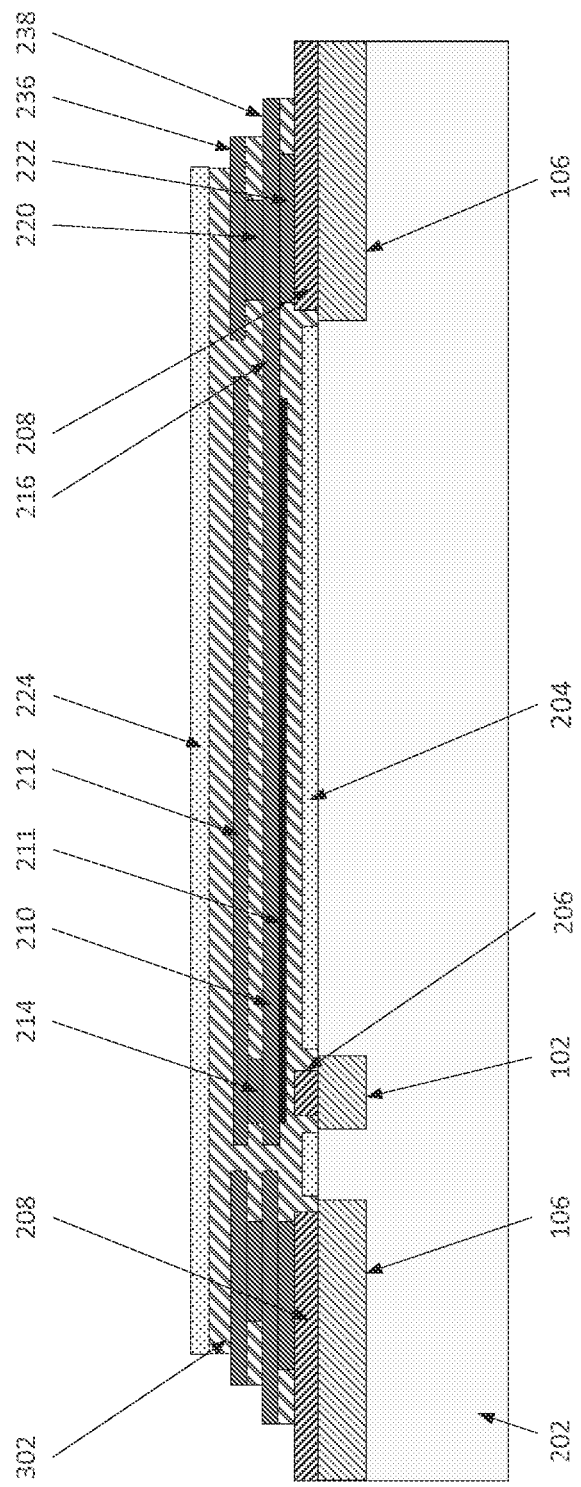

FIG. 4D shows the formation of the pull-up electrode by depositing additional sacrificial material 302 and an insulating dielectric layer 224. Suitable materials for the electrically insulating layer 224 include silicon based materials including silicon-oxide, silicon-dioxide, silicon-nitride and silicon-oxynitride. The dielectric layer 224 and sacrificial material 302 are patterned to form the cavity outline, thereby exposing portions 238 of the lower MEMS-cantilever layer and 236 of the upper MEMS-cantilever layer as well as a portion of the anchor contact layer 208.

Figure 4E:
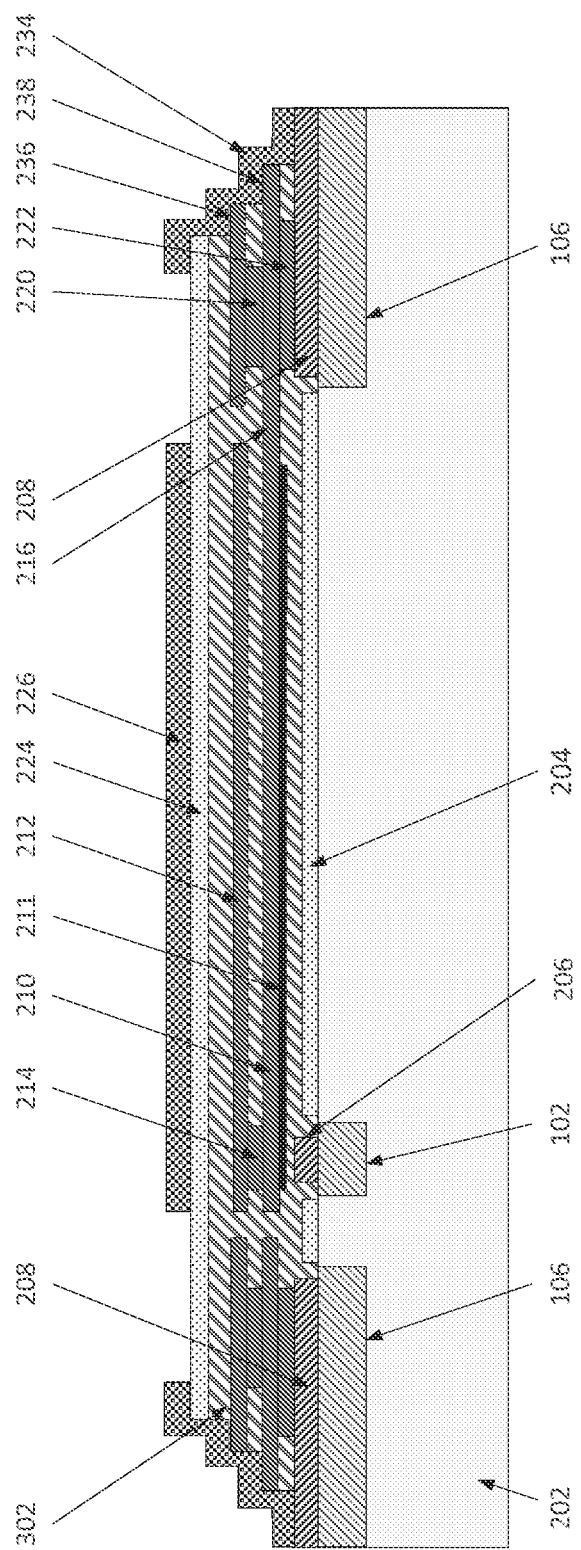

FIG. 4E shows the formation of the pull-up (control) electrode 226 as well as the sidewall electrical connections 234, which connects to the exposed portions 236 of the upper MEMS-cantilever layer, to exposed portions 238 of the lower MEMS-cantilever layer and to the anchor contact 208, thus providing an additional current path from the MEMS cantilever 210, 212 to the anchor contact 208 in parallel with the anchor vias 220, 222.

Figure 4F:
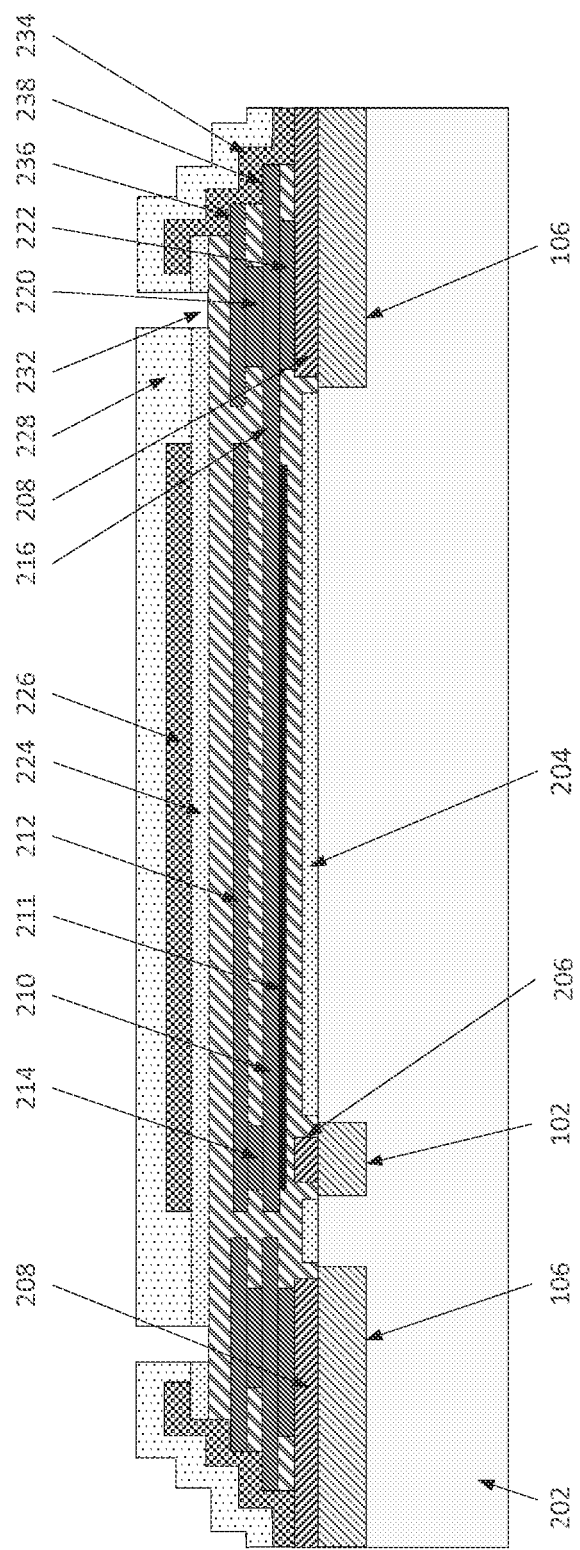

FIG. 4F shows the formation of the cavity roof, by depositing a dielectric material 228. Suitable materials for the electrically insulating layer 228 include silicon based materials including silicon-oxide, silicon-dioxide, silicon-nitride and silicon-oxynitride. This layer provides additional mechanical strength to the roof. Etch release holes 232 are opened which exposes the sacrificial material in the cavity.

Figure 4G:
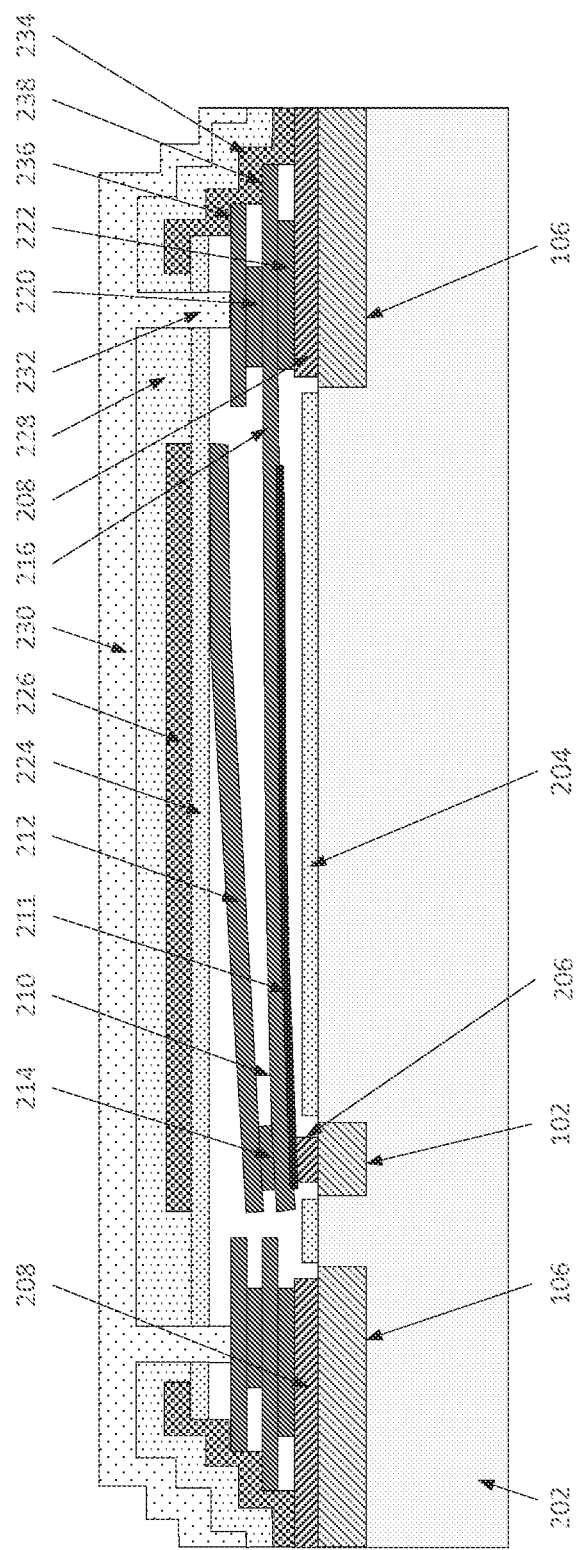

FIG. 4G shows the MEMS switch after the sacrificial layer has been removed through the release holes 232 and sealed with dielectric layer 230. The dielectric layer 230 also is deposited inside the etch release holes 232 and lands on upper MEMS layer 212 providing additional mechanical strength to the anchors. Because the stress layer 211 has a higher tensile stress than the lower cantilever layer 210, the cantilever will deflect downwards until it hits the RF-contact 206 and the switch provides an ohmic contact between 102 and 106.

By utilizing a contacting switch, ESD damage to other MEMS devices in the package is avoided. The contacting switch is naturally in the closed position and is opened upon applying a voltage. Hence, there is little to no damage to a MEMS device employing these ESD-protection devices.

While the foregoing is directed to embodiments of the present disclosure, other and further embodiments of the disclosure may be devised without departing from the basic scope thereof, and the scope thereof is determined by the claims that follow.

The invention claimed is:

1. A MEMS device, comprising:
  a substrate having an anchor electrode and an RF electrode disposed therein;
  a switching element comprising a stress layer, a bottom layer and a top layer, wherein the bottom layer is coupled to the top layer by a via at a first end of the switching element that is closest to the RF electrode and the bottom layer is coupled to the anchor electrode at a second end of the switching element and wherein the stress layer is under tensile stress and wherein the stress layer is in contact with a bottom surface of the bottom layer; and
  an insulating layer disposed over the switching element, wherein the top layer is coupled to and in contact with the insulating layer at the second end.

2. The MEMS device of claim 1, further comprising an anchor contact disposed between the anchor electrode and the bottom layer.

3. The MEMS device of claim 1, further comprising an RF contact disposed on the RF electrode, wherein the stress layer moves from a position in contact with the RF contact and a position spaced from the RF contact.

4. The MEMS device of claim 3, further comprising an additional insulating layer disposed on a bottom surface of the stress layer, where the additional insulating layer has an opening at a location corresponding to the RF contact such that a portion of the stress layer is exposed to make contact with the RF contact.

5. The MEMS device of claim 1, wherein the stress in the stress layer is more tensile than stress in the bottom layer.

6. The MEMS device of claim 1, further comprising an additional insulating layer disposed on a bottom surface of the stress layer, where the additional insulating layer has an opening at a location corresponding to the RF electrode such that a portion of the stress layer is exposed.

7. A MEMS device, comprising:
  a substrate having an anchor electrode and an RF electrode disposed therein; and
  a switching element comprising a stress layer, a bottom layer and a top layer, wherein the bottom layer is coupled to the top layer at a first end of the bottom layer that is closest to the RF electrode and the bottom layer is coupled to the anchor electrode at a second end of the bottom layer and wherein the stress layer is under tensile stress and wherein the stress layer is in contact with a bottom surface of the bottom layer further comprising: a pull-up electrode disposed over the switching element; and an insulating layer disposed between the top layer and the pull-up electrode, wherein the top layer is coupled to and in contact with the insulating layer at a first location.

8. The MEMS device of claim 7, wherein the top layer is spaced from the bottom layer at the first location.

9. The MEMS device of claim 8, wherein the top layer is coupled to the bottom layer at a location adjacent the RF electrode.

10. The MEMS device of claim 9, wherein the switching element is capable of moving a first distance away from the RF electrode by applying a first voltage to the pull-up electrode.

11. The MEMS device of claim 10, wherein the switching element is capable of moving a second distance away from the RF electrode when applying a second voltage, wherein the second distance is greater than the first distance, and the second voltage is greater than the first voltage.

12. The MEMS device of claim 11, wherein the top layer, when at the second distance, is in contact with the insulating layer.

13. The MEMS device of claim 12, wherein the top layer remains in contact with the insulating layer, and the stress layer remains spaced from the RF electrode, when the second voltage is removed.

14. The MEMS device of claim 13, wherein the stress layer returns to a position in contact with an RF contact when the first voltage is removed.

15. The MEMS device of claim 7, wherein the top layer remains in contact with the insulating layer when the stress layer is in contact with an RF contact.

* * * * *

UNITED STATES PATENT AND TRADEMARK OFFICE
CERTIFICATE OF CORRECTION

PATENT NO. : 10,964,505 B2
APPLICATION NO. : 15/772132
DATED : March 30, 2021
INVENTOR(S) : Robertus Petrus Van Kampen et al.

Page 1 of 1

It is certified that error appears in the above-identified patent and that said Letters Patent is hereby corrected as shown below:

In the Specification

Column 2, Line 7, replace "pair of analog/RF 10's" with --pair of analog/RF IO's--.
Column 3, Lines 8, 12, and 16, replace "analog/RF 10's" with --analog/RF IO's--.

Signed and Sealed this
Sixth Day of July, 2021

Drew Hirshfeld
*Performing the Functions and Duties of the*
*Under Secretary of Commerce for Intellectual Property and*
*Director of the United States Patent and Trademark Office*